United States Patent
Jung

(10) Patent No.: US 10,431,316 B2
(45) Date of Patent: Oct. 1, 2019

(54) MEMORY SYSTEM AND OPERATING METHOD THEREOF

(71) Applicant: SK hynix Inc., Gyeonggi-do (KR)

(72) Inventor: Sang Hune Jung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/107,008

(22) Filed: Aug. 21, 2018

(65) Prior Publication Data

US 2019/0206501 A1   Jul. 4, 2019

(30) Foreign Application Priority Data

Jan. 4, 2018   (KR) .................. 10-2018-0001052

(51) Int. Cl.
  *G11C 16/34*   (2006.01)
  *G11C 11/56*   (2006.01)
  *G11C 16/10*   (2006.01)
  *G11C 16/26*   (2006.01)

(52) U.S. Cl.
  CPC ...... *G11C 16/3459* (2013.01); *G11C 11/5628* (2013.01); *G11C 16/10* (2013.01); *G11C 16/3404* (2013.01); *G11C 16/349* (2013.01); *G11C 16/26* (2013.01); *G11C 16/3454* (2013.01); *G11C 16/3463* (2013.01); *G11C 2211/5621* (2013.01)

(58) Field of Classification Search
  CPC .................. G11C 16/3454; G11C 16/3463
  USPC ....................... 365/185.22, 185.24
  See application file for complete search history.

(56) References Cited

U.S. PATENT DOCUMENTS 8,085,591 B2 * 12/2011 Moschiano ......... G11C 11/5628
                                                  365/185.22

FOREIGN PATENT DOCUMENTS

KR      1020170100724      9/2017

* cited by examiner

*Primary Examiner* — Son L Mai
(74) *Attorney, Agent, or Firm* — IP & T Group LLP

(57) ABSTRACT

A memory system includes a nonvolatile memory device including a plurality of memory cells; and a controller including a control unit and a random-access memory, and configured to determine, by applying a program verify voltage to at least one memory cell to be programmed with program data, whether the program data is programmed, wherein the control unit determines percentages of a count of read requests received from a host device and a count of program requests received from the host device, and adjusts a level of the program verify voltage based on the percentages.

20 Claims, 11 Drawing Sheets

<Verify voltage level table>

| Index | Read request(%) | Program request(%) | Verify voltage level |
|---|---|---|---|
| 1 | 0~20 | 80~100 | Vvrf_P1 |
| 2 | 21~40 | 60~79 | Vvrf_P2 |
| 3 | 41~60 | 40~59 | Vvrf_P3 |
| 4 | 61~80 | 20~39 | Vvrf_P4 |
| 5 | 81~100 | 0~19 | Vvrf_P5 |

<Verify voltage level table>

| Index | Read request(%) | Program request(%) | Verify voltage level |
|---|---|---|---|
| 1 | 0~20 | 80~100 | Vvrf_P11, Vvrf_P21, Vvrf_P31 |
| 2 | 21~40 | 60~79 | Vvrf_P12, Vvrf_P22, Vvrf_P32 |
| 3 | 41~60 | 40~59 | Vvrf_P13, Vvrf_P23, Vvrf_P33 |
| 4 | 61~80 | 20~39 | Vvrf_P14, Vvrf_P24, Vvrf_P34 |
| 5 | 81~100 | 0~19 | Vvrf_P15, Vvrf_P25, Vvrf_P35 | ered
MEMORY SYSTEM AND OPERATING METHOD THEREOF

CROSS-REFERENCES TO RELATED APPLICATION

The present application claims priority under 35 U.S.C. § 119(a) to Korean application number 10-2018-0001052, filed on Jan. 4, 2018, in the Korean Intellectual Property Office, which is incorporated herein by reference in its entirety.

BACKGROUND

1. Technical Field

Various embodiments generally relate to a memory system, and, more particularly, to a memory system including a nonvolatile memory device.

2. Related Art

A memory system may be configured to store the data provided from an external device, in response to a write request from the external device. Also, the memory system may be configured to provide stored data to the external device, in response to a read request from the external device. The external device is an electronic device capable of processing data. Suitable external devices may include, for example, a computer, a digital camera or a mobile phone. The memory system may operate by being built in the external device, or may operate by being manufactured in a separable form and being coupled to the external device.

A memory system using a memory device provides advantages in that, since there is no mechanical driving part, stability and durability are excellent, an information access speed is high and power consumption is small. Memory systems having such advantages include a universal serial bus (USB) memory device, memory cards having various interfaces, a universal flash storage (UFS) device, and a solid-state drive (SSD).

SUMMARY

Various embodiments of the present invention are directed to a memory system capable of adjusting the performance speed of an operation to be performed in a nonvolatile memory device based on a request pattern of a host. Various embodiments of the present invention are also directed to an operating method of the memory system.

In an embodiment, a memory system may include: a nonvolatile memory device including a plurality of memory cells; and a controller including a control unit and a random-access memory, and configured to determine, by applying a program verify voltage to at least one memory cell to be programmed with program data, whether the program data is programmed, wherein the control unit determines percentages of a count of read requests received from a host device and a count of program requests received from the host device, and adjusts a level of the program verify voltage based on the percentages.

In an embodiment, a memory system may include: a controller; and a nonvolatile memory device configured to perform a program operation for program data in response to a program command received from the controller, wherein the controller determines percentages of a count of read requests received from a host device and a count of program requests received from the host device, and performs a control task to adjust a threshold voltage distribution of memory cells to be programmed with the program data, based on the percentages.

In an embodiment, a method for operating a memory system may include: determining, by a controller, percentages of a count of read requests received from a host device and a count of program requests received from the host device; and controlling an operation in which program data is programmed to a nonvolatile memory device, based on the percentages, by the controller.

In the memory system according to various embodiments of the present invention, by adjusting the performance speeds of program and read operations based on the request pattern of a host, the efficiency of a device may be improved.

These and other features and advantages of the present invention will become apparent to those with ordinary skill in the art to which the present invention belongs from the following description in conjunction with the accompanying drawings.

In an embodiment, an operation method of a controller, the method comprising: controlling a nonvolatile memory device to perform a program operation with lower program verify voltage then an original program verify voltage when program requests are provided greater than read requests from a host by a first amount for a predetermined time; and controlling a nonvolatile memory device to perform a program operation with higher program verify voltage then the original program verify voltage when program requests are provided lesser than read requests from the host by a second amount for the predetermined time.

DETAILED DESCRIPTION

Figure 1:
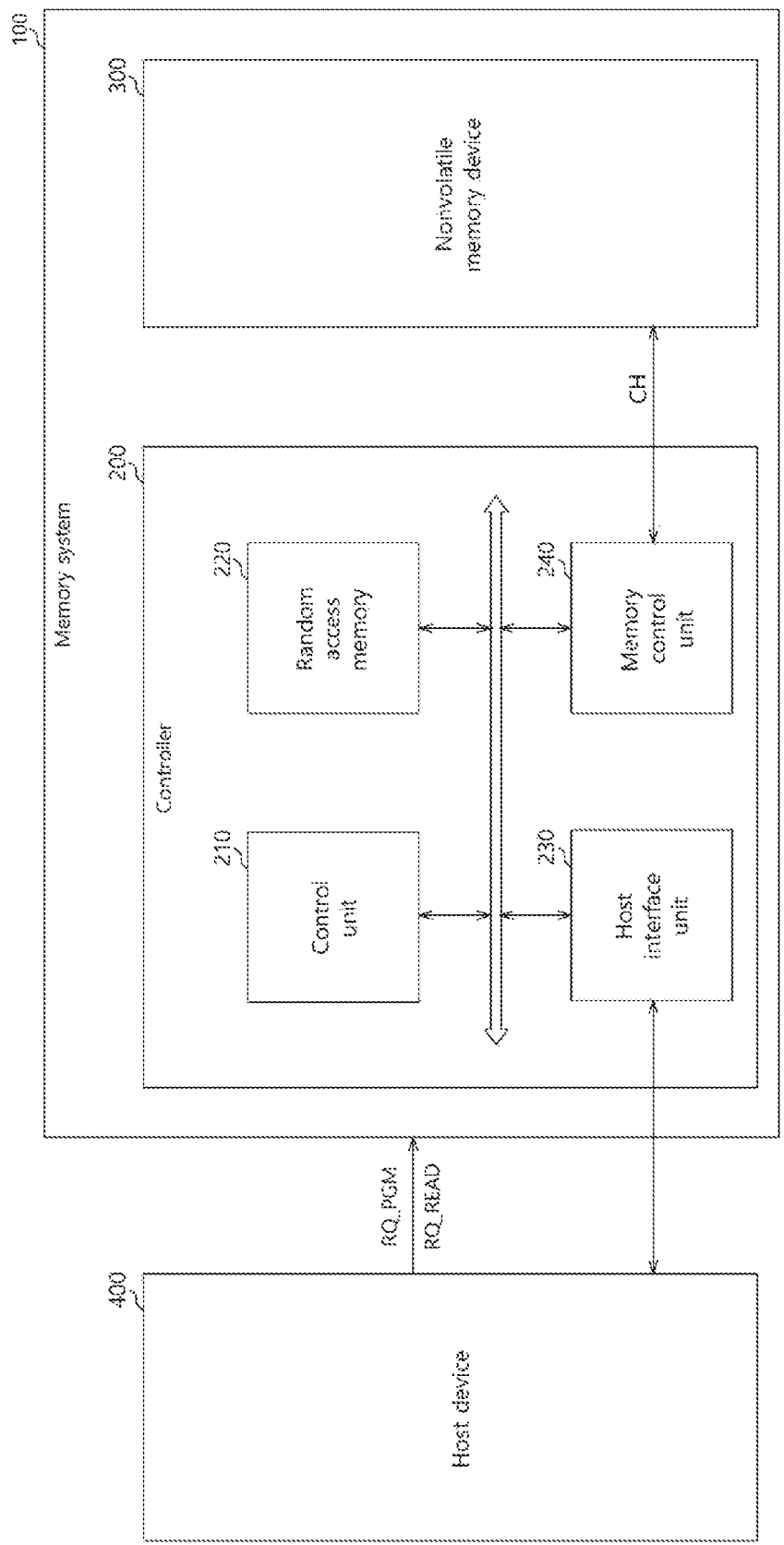
FIG. 1 is a simplified schematic block diagram of a memory system, in accordance with an embodiment of the present invention.

In the present invention, advantages, features and methods for achieving them will become more apparent after a reading of the following exemplary embodiments taken in conjunction with the drawings. The present invention may, however, be embodied in different forms and should not be construed as being limited to the embodiments set forth herein. Rather, these embodiments are provided to describe the present invention in detail to the extent that a person skilled in the art to which the invention pertains can easily enforce the technical concept of the present invention.

It is to be understood herein that embodiments of the present invention are not limited to the particulars shown in the drawings and that the drawings are not necessarily to scale and in some instances proportions may have been exaggerated in order to more clearly depict certain features of the invention. While particular terminology is used herein, it is to be appreciated that the terminology used herein is for the purpose of describing particular embodiments only and is not intended to limit the scope of the present invention.

As used herein, the term "and/or" includes any and all combinations of one or more of the associated listed items. It will be understood that when an element is referred to as being "on," "connected to" or "coupled to" another element, it may be directly on, connected or coupled to the other element or intervening elements may be present. As used herein, a singular form is intended to include plural forms as well, unless the context clearly indicates otherwise. It will be further understood that the terms "includes" and/or "including," when used in this specification, specify the presence of at least one stated feature, step, operation, and/or element, but do not preclude the presence or addition of one or more other features, steps, operations, and/or elements thereof.

It should also be appreciated by the skilled person in the art to which the present invention belongs that in some instances in describing the various embodiments of the present invention some details may be described which may not be needed to practice the invention.

Also, in some instances, as it should be appreciated by the skilled person in the art to which the present invention belongs, a feature described in relation to an embodiment may also be employed in another embodiment as may be needed without departing from the scope of the present invention.

Hereinafter, a memory system and an operating method thereof will be described below with reference to the accompanying drawings through various examples of embodiments.

FIG. 1 is a simplified schematic block diagram of an exemplary configuration of a memory system 100 in accordance with an embodiment of the present invention.

The memory system 100 may store data to be accessed by a host device 400 such as a mobile phone, an MP3 player, a laptop computer, a desktop computer, a game player, a TV, an in-vehicle infotainment system, and so forth.

The memory system 100 may be manufactured as any one of various kinds of storage devices according to a host interface meaning a transmission protocol with the host device 400. For example, the memory system 100 may be configured as any one of various kinds of storage devices such as a solid state drive (SSD), a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, a memory stick, and so forth.

The memory system 100 may be manufactured as any one among various package types, such as a package-on-package (POP), a system-in-package (SIP), a system-on-chip (SOC), a multi-chip package (MCP), a chip-on-board (COB), a wafer-level fabricated package (WFP) and a wafer-level stack package (WSP).

The memory system 100 may include a controller 200. The controller 200 may include a control unit 210, a random-access memory 220, a host interface unit 230 and a memory control unit 240.

The control unit 210 may be a micro control unit (MCU) or a central processing unit (CPU). The control unit 210 may process a request RQ which is transmitted from the host device 400. In order to process the request RQ, the control unit 210 may drive an instruction or algorithm of a code type, e.g., a firmware (FW), loaded in the random-access memory 220, and may control various internal function blocks and a nonvolatile memory device 300.

The random-access memory 220 may be a dynamic random-access memory (DRAM) or a static random-access memory (SRAM). The random-access memory 220 may store firmware (FW) which is to be driven by the control unit 210. Also, the random-access memory 220 may store data for driving the firmware (FW), for example, metadata. That is, the random-access memory 220 may operate as the working memory of the control unit 210.

The host interface unit 230 may interface the host device 400 and the memory system 100. For instance, the host interface unit 230 may communicate with the host device 400 through any suitable transmission protocol such as, for example, secure digital, universal serial bus (USB), multimedia card (MMC), embedded MMC (eMMC), personal computer memory card international association (PCMCIA), parallel advanced technology attachment (DATA), serial advanced technology attachment (SATA), small computer system interface (SCSI), serial attached SCSI (SAS), peripheral component interconnection (PCI), PCI express (PCI-E) and universal flash storage (UFS), that is, by using a host interface.

The memory control unit 240 may control the nonvolatile memory device 300 according to the control of the control unit 210. The memory control unit 240 may also be referred to as a memory interface unit. The memory control unit 240 may provide a plurality of signals to the nonvolatile memory device 300 including, for example, command, address, control signals and so forth for controlling the nonvolatile memory device 300. The memory control unit 240 may provide data to the nonvolatile memory device 300 or may be provided with data from the nonvolatile memory device 300.

In operation, the controller 200 may receive an operation request from the host device 400, and may transmit an operation command corresponding to the received operation request, to the nonvolatile memory device 300. The operation command may be generated by the control unit 210 based on the received request from the host device 400. Alternatively, the operation command may be part of the received request from the host device 400.

For example, the controller 200 may receive a program request RQ_PGM for program data from the host device 400, and may generate and transmit a program command including the program data and an address of the nonvolatile memory device 300 specifying where the program data is to be stored, to the nonvolatile memory device 300. For another example, the controller 200 may receive a read request RQ_READ for read data from the host device 400, and may generate and transmit a read command including an address of the nonvolatile memory device 300 specifying where the read data to be read is stored, to the nonvolatile memory device 300. The controller 200 may receive an operation request from the host device 400 through the host interface unit 230, and may transmit an operation command to the nonvolatile memory device 300, through the memory control unit 240.

Figures 2, 3:
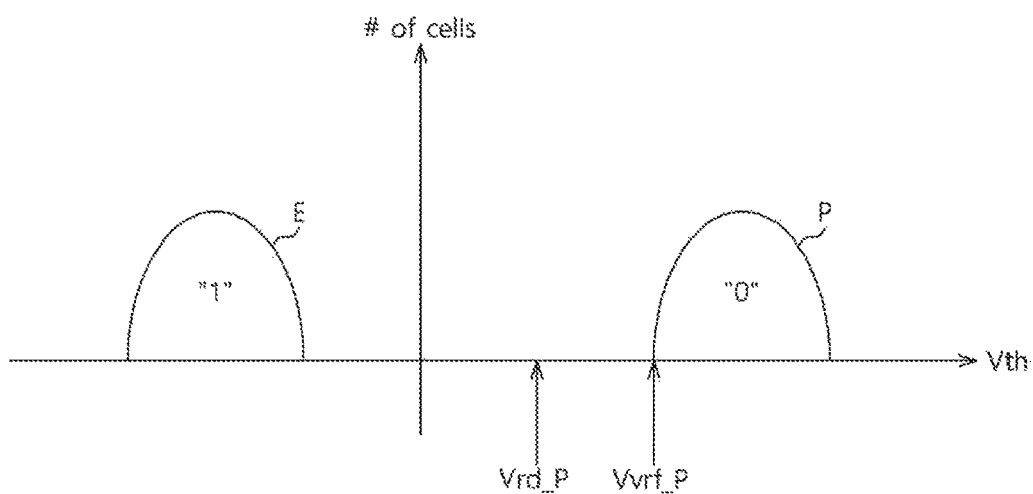
FIG. 2 is an example of a threshold voltage distribution diagram of program states of single-level cells (SLCs).
FIG. 3 is a diagram illustrating an example of a verify voltage level table in the case where one bit is stored in each memory cell in accordance with an embodiment of the present invention.

FIG. 2 is an example of a threshold voltage distribution diagram of program states of SLCs. An SLC stores only one bit of information. In describing FIG. 2, it is assumed that memory cells are erased or programmed to have an erase state E or a program state P as a default state. Hereinbelow, descriptions will be made with reference to FIGS. 1 and 2.

In a program verify operation, a program verify voltage Vvrf_P is applied to the word line of selected memory cells. The program verify voltage Vvrf_P is a voltage suitable for verifying whether memory cells are programmed to the program state P. When memory cells are read out according to the program verify voltage Vvrf_P, a memory cell having a threshold voltage that is higher than the program verify voltage Vvrf_P is determined as an off-cell. According to an embodiment, a memory cell having a threshold voltage higher than the program verify voltage Vvrf_P may be determined as an off-cell which stores data "0." A memory cell which is determined as an off-cell is determined to be program-completed. Conversely, when memory cells are read out according to the program verify voltage Vvrf_P, a memory cell having a threshold voltage that is lower than the program verify voltage Vvrf_P is determined as an on-cell. According to an embodiment, a memory cell having a threshold voltage that is lower than the program verify voltage Vvrf_P may be determined as an on-cell which stores data "1." A memory cell which is determined as an on-cell is determined not to be program-completed.

In a read operation, a read voltage Vrd_P is applied to the word line of selected memory cells. The read voltage Vrd_P is a voltage suitable for differentiating memory cells which are in the erase state E from memory cells which are in the program state P. When memory cells are read out according to the read voltage Vrd_P, a memory cell having a threshold voltage that is higher than the read voltage Vrd_P is determined as an off-cell. According to an embodiment, a memory cell having a threshold voltage that is higher than the read voltage Vrd_P may be determined as an off-cell which stores data "0." A memory cell which is determined as an off-cell is determined to be in the program state P. Conversely, when memory cells are read out according to the read voltage Vrd_P, a memory cell having a threshold voltage that is lower than the read voltage Vrd_P is determined as an on-cell. According to an embodiment, a memory cell having a threshold voltage that is lower than the read voltage Vrd_P may be determined as an on-cell which stores data "1." A memory cell which is determined as an on-cell is determined to be in the erase state E.

As described above, whether program data is program-completed is determined by applying the program verify voltage Vvrf_P wherein the program verify voltage Vvrf_P has a predetermined fixed level. Also, in a read operation for read data, whether the read operation is completed is determined based on the number of memory cells determined to be on-cells, by applying the read voltage Vrd_P having a predetermined fixed level. In the case of performing a program operation by applying the fixed program verify voltage Vvrf_P, a time for programming the same data (for example, "0") may be within a predetermined time range. Similarly, in the case of performing a read operation by applying the fixed read voltage Vrd_P, a time for reading the same data (for example, "0") may also be within a predetermined time range.

The percentages of the requests, for example, program requests RQ_PGM and read requests RQ_READ, outputted from the host device 400 may vary depending on the request pattern of the host device 400. For example, the count of program requests RQ_PGM may be higher than the count of read requests RQ_READ in the case where the host device 400 mainly stores data in the memory system 100, and, conversely, the count of read requests RQ_READ may be higher than the count of program requests RQ_PGM in the case where the host device 400 mainly reads data from the memory system 100. In the case where a program operation and a read operation are performed at regular speed irrespective of the request pattern of the host device 400, a disadvantage may result in that, even when it is required to quickly perform a particular one between the program operation and the read operation, the requirement is not properly fulfilled by the memory system 100.

In the memory system 100 in accordance with an embodiment, by adjusting the level of a program verify voltage based on the request pattern of the host device 400, the operation speeds of a program operation and a read operation may be adjusted. This will be described below.

FIG. 3 is a diagram illustrating an example of a verify voltage level table in the case where one bit is stored in each memory cell in accordance with an embodiment of the present invention.

In FIG. 3, five entries of the percentages of a read request count, and a program request count are described as an example. Also, a verify voltage level corresponding to each of the five entries of the percentages of the read request and the program request are described. It is noted that this is just an example, and that the number of the entries may vary by design.

According to an embodiment, the random-access memory 220 may store a verify voltage level table including the levels of the program verify voltages corresponding to a plurality of request patterns based on the percentage ranges for the read request counts and program request counts for each request pattern.

Referring to FIGS. 1 and 3, the verify voltage level table may include an index field, a field for the percentages of the counts of read requests RQ_READ, a field for the percentages of the counts of program requests RQ_PGM and a field for the verify voltage levels.

According to FIG. 3, a first entry of index 1 has a verify voltage level Vvrf_P1 which is applied when it is determined that the count of read requests RQ_READ falls in the percentage ranging from 0 to 20% and the count of program requests RQ_PGM falls in the percentage ranging from 80 to 100%.

A second entry of index 2 has a verify voltage level Vvrf_P2 which is applied when it is determined that the count of read requests RQ_READ falls in the percentage ranging from 21 to 40% and the count of program requests RQ_PGM falls in the percentage ranging from 60 to 79%.

A third entry of index 3 has a verify voltage level Vvrf_P3 which is applied when it is determined that the count of read requests RQ_READ falls in the percentage ranging from 41 to 60% and the count of program requests RQ_PGM falls in the percentage ranging from 40 to 59%.

A fourth entry of index 4 has a verify voltage level Vvrf_P4 which is applied when it is determined that the count of read requests RQ_READ falls in the percentage ranging from 61 to 80% and the count of program requests RQ_PGM falls in the percentage ranging from 20 to 39%.

A fifth entry of index 5 has a verify voltage level Vvrf_P5 which is applied when it is determined that the count of read requests RQ_READ falls in the percentage ranging from 81 to 100% and the count of program requests RQ_PGM falls in the percentage ranging from 0 to 19%.

According to an embodiment, the control unit 210 may adjust a program verify voltage level based on the verify voltage level table as exemplified in FIG. 3.

Figure 4:
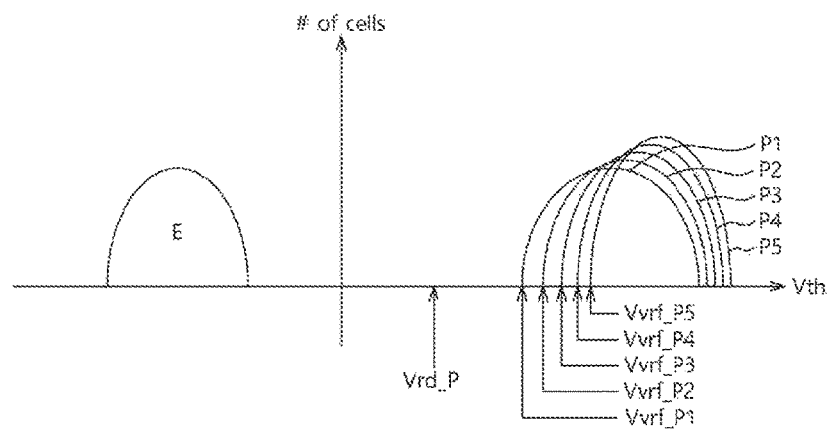
FIG. 4 is an example of a threshold voltage distribution diagram of program states of memory cells in the case where the level of a verify voltage for SLCs is adjusted in accordance with an embodiment of the present invention.

FIG. 4 is an example of a threshold voltage distribution diagram to assist in the explanation of the program states of memory cells in the case where the level of a verify voltage for SLCs is adjusted in accordance with an embodiment of the present invention. For the sake of convenience in explanation, it is assumed that the read voltage Vrd_P shown in FIG. 4 is the same as the above-described read voltage Vrd_P of FIG. 2. Also, it is assumed that the program state P3 of FIG. 4 is the same as the above-described program state P of FIG. 2. That is, descriptions will be made with reference to FIG. 4 on the assumption that memory cells have the same threshold voltage distributions as described with reference to FIG. 2.

Referring to FIGS. 1, 3 and 4, the memory system 100 in accordance with an embodiment may include the controller 200 and the nonvolatile memory device 300.

The controller 200 may determine the percentages of the count of the read requests RQ_READ received from the host device 400 and the count of the program requests RQ_PGM received from the host device 400, and may adjust the level of a program verify voltage based on the determined percentages.

According to an embodiment, when the count of read requests RQ_READ is greater than the count of program requests RQ_PGM, the level of a program verify voltage may be increased and when the count of read requests RQ_READ is less than the count of program requests RQ_PGM, the level of a program verify voltage may be decreased.

As shown in FIG. 4, a level of the program verify voltage increases from a program verify voltage Vvrf_P1 to a program verify voltage Vvrf_P5. It is assumed that, in the case where memory cells are successfully programmed according to the program verify voltage Vvrf_P1, a program verify voltage Vvrf_P2, a program verify voltage Vvrf_P3, a program verify voltage Vvrf_P4 and the program verify voltage Vvrf_P5, the successfully programmed memory cells have a program state P1, a program state P2, the program state P3, a program state P4 and a program state P5, respectively. The memory cells having the program states sequentially from the program state P5 to the program state P1 have increasingly lower and wider threshold voltage distributions, as exemplified in FIG. 4.

According to an embodiment, the percentages of the count of read requests RQ_READ and the count of program requests RQ_PGM may be determined under the condition that the memory cells have the program state P3. The program verify voltage level Vvrf_P3 may be a reference program verify voltage level.

The program verify voltage level may be adjusted to be decreased from the program verify voltage level Vvrf_P3 in the case where the count of program requests RQ_PGM is greater than the count of read requests RQ_READ. For example, the program verify voltage Vvrf_P1 may be selected to decrease the program verify voltage from the program verify voltage level Vvrf_P3. As shown, in the program state P1 corresponding to the program verify voltage level Vvrf_P1, a threshold voltage distribution is widely dispersed when compared to the program state P3 corresponding to the program verify voltage level Vvrf_P3, and relatively many memory cells having voltages dose to the read voltage Vrd_P are distributed. Therefore, in the case where adjustment is made from the program verify voltage Vvrf_P3 to the program verify voltage Vvrf_P1, the number of memory cells to be determined as off-cells may increase during the program operation to memory cells to have the program state P3, and the operation speed of the program operation may become higher. In other words, as the number of times by which a program voltage is applied decreases (i.e., the time taken to perform the program verify operation decrease), a time required for completing a program operation may decrease.

In this case of decrease from the program verify voltage Vvrf_P3 to the program verify voltage Vvrf_P1, when the read voltage Vrd_P is applied for a read operation for the data programmed to have the program state P3 by applying the program verify voltage Vvrf_P1, the number of memory cells to be determined as off-cells may increase in comparison with when the program verify voltage Vvrf_P3 is applied, and accordingly, the number of cases where an error correction operation fails may increase. Namely, the number of times by which a read voltage is applied may increase, and as a result, the operation speed of the read operation may become lower.

On the other hand, the program verify voltage level may be increased from the program verify voltage level Vvrf_P3 in the case where the count of read requests RQ_READ is greater than the count of program requests RQ_PGM. For example, the program verify voltage Vvrf_P5 may be selected to increase the program verify voltage from the program verify voltage level Vvrf_P3. As shown, in the program state P5 corresponding to the program verify voltage level Vvrf_P5, a threshold voltage distribution is relatively concentrated when compared to the program state P3 corresponding to the program verify voltage level Vvrf_P3, and relatively small memory cells having voltages close to the read voltage Vrd_P are distributed. Therefore, in the case where adjustment is made from the program verify voltage Vvrf_P3 to the program verify voltage Vvrf_P5, the number of memory cells to be determined as off-cells may decrease during the program operation to memory cells to have the program state P3, and the operation speed of the program operation may become lower. In other words, as the number of times by which a program voltage is applied increases (i.e., the time taken to perform the program verify operation increase), a time required for completing a program operation may increase.

In this case of increase from the program verify voltage Vvrf_P3 to the program verify voltage Vvrf_P5, when the read voltage Vrd_P is applied for a read operation for the data programmed to have the program state P3 by applying the program verify voltage Vvrf_P5, the number of memory cells to be determined as off-cells may decrease in comparison with when the program verify voltage Vvrf_P3 is applied, and accordingly, the number of cases where an error correction operation fails may decrease. Namely, the number of times by which a read voltage is applied may decrease, and as a result, the operation speed of the read operation may become higher.

According to the present embodiment, the level adjustment of a program verify voltage depending on the percentages of the count of read requests RQ_READ and the count of program requests RQ_PGM, which represents the request pattern of the host device 400, leads to the adjustment of the operation speeds of the read and program operations and thus the utilization efficiency of a device may be improved. In detail, in the case where the host device 400 mainly reads data from the memory system 100 or has a high percentage of read requests, a time required for performing a read operation may be shortened by raising the level of a program verify voltage, and in the case where the host device 400 mainly stores data in the memory system 100 or has a high percentage of program requests, a time required for performing a program operation may be decreased by lowering the level of a program verify voltage.

Figure 5:
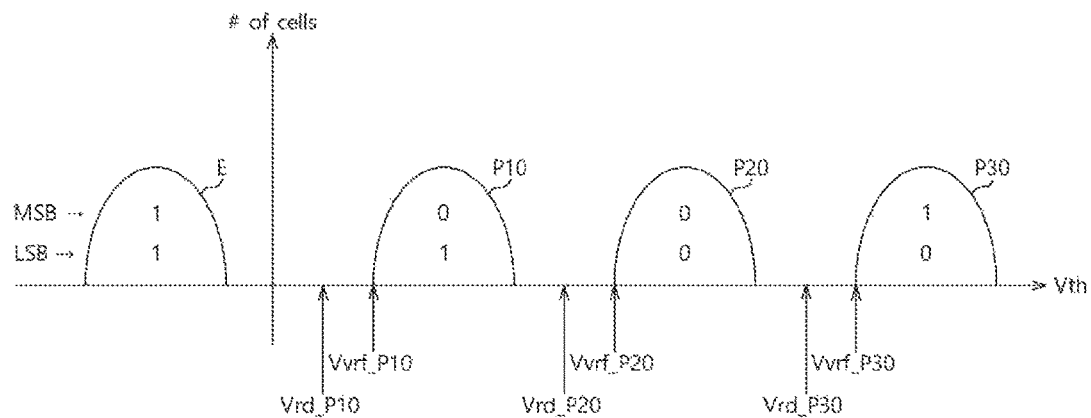
FIG. 5 is an example of a threshold voltage distribution of program states of multi-level cells (MLCs), each storing two bits.

FIG. 5 is an example of a threshold voltage distribution diagram of the program states of MLCs in the case where two bits are stored in each memory cell.

With reference to FIG. 5, it will be described as an example that a second read voltage Vrd_P20 is used as a voltage for reading least significant bit (LSB) data and a first read voltage Vrd_P10 and a third read voltage Vrd_P30 are used as voltages for reading most significant bit (MSB) data. However, if bit data symbols that are meant by an erase state E and first to third program states P10, P20 and P30 are set differently from the example of FIG. 5, a read voltage for reading LSB data and a read voltage for reading MSB data may be changed correspondingly.

Referring to FIG. 5, 2-*bit* multi-level cells may be erased or programmed to have a threshold voltage distribution corresponding to any one of the erase state E and the plurality of program states P10, P20 and P30 depending on multi-bit data, that is, LSB data and MSB data. In a read operation, any one of the first read voltage Vrd_P10 having a voltage level between the erase state E and the first program state P10, the second read voltage Vrd_P20 having a voltage level between the first program state P10 and the second program state P20 and the third read voltage Vrd_P30 having a voltage level between the second program state P20 and the third program state P30 may be applied to memory cells.

If the second read voltage Vrd_P20 is applied, memory cells having the threshold voltage distributions of the erase state E and the first program state P10 may be determined as on-cells which store LSB data "1," and memory cells having the threshold voltage distributions of the second program state P20 and the third program state P30 may be determined as off-cells which store LSB data "0."

If the first read voltage Vrd_P10 is applied, memory cells having the threshold voltage distribution of the erase state E may be determined as on-cells which store MSB data "1," and memory cells having the threshold voltage distribution of the first program state P10 may be determined as off-cells which store MSB data "0."

If the third read voltage Vrd_P30 is applied, memory cells having the threshold voltage distribution of the second program state P20 may be determined as on-cells, and memory cells having the threshold voltage distribution of the third program state P30 may be determined as off-cells.

That is, through applying the first read voltage Vrd_P10 and the third read voltage Vrd_P30, it is possible to discriminate memory cells in which MSB data "0" is stored and memory cells in which MSB data "1" is stored.

As described above with reference to FIG. 2, the percentages of the requests outputted from the host device 400 may vary depending on the request pattern of the host device 400. In the case where a program operation and a read operation are performed at a regular speed irrespective of the request pattern of the host device 400, a disadvantage may result in that, even when it is required to quickly perform a particular one between the program operation and the read operation, the requirement is not properly fulfilled by the memory system 100.

In the memory system 100 in accordance with an embodiment, by adjusting the level of a program verify voltage based on the request pattern of the host device 400, operation speeds of a program operation and a read operation may be adjusted.

Figures 6, 7:
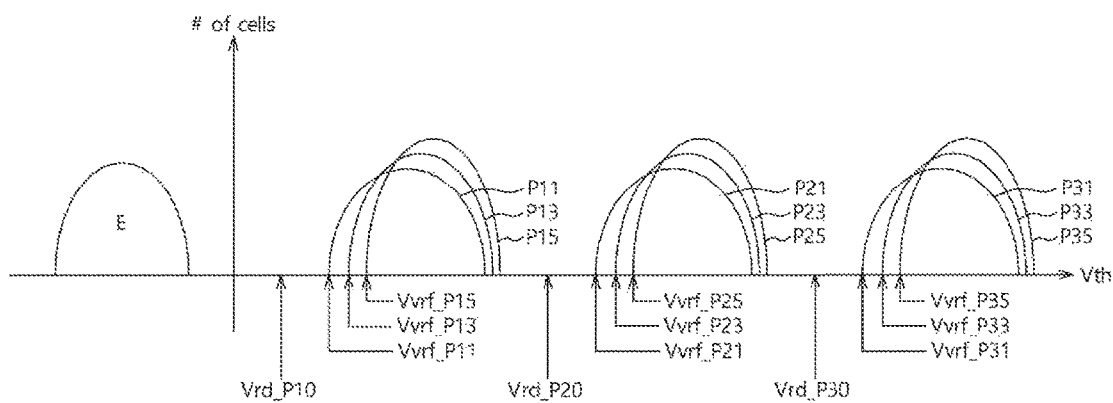
FIG. 6 is an example of a verify voltage level table in the case where two bits are stored in each memory cell in accordance with an embodiment of the present invention.
FIG. 7 is an example of a threshold voltage distribution diagram of program states of MLCs in the case where the level of a verify voltage is adjusted in accordance with an embodiment of the present invention.

FIG. 6 is a diagram illustrating an example of a verify voltage level table in the case where two bits are stored in each memory cell in accordance with an embodiment of the present invention.

In FIG. 6, described as an example are five entries of the percentages of a read request count and a program request count and verify voltage levels corresponding thereto. However, this is for illustration purposes only and it is to be noted that the number of the entries may vary.

According to an embodiment, the random-access memory 220 may store a verify voltage level table including the levels of program verify voltages corresponding to a plurality of percentages for the read request counts and program request counts. As described above with reference to FIG. 5, in the case where two bits are stored in each memory cell, read voltages having three different levels may be used. Also, program verify voltages having three different levels may be used.

Referring to FIGS. 1 and 6, the verify voltage level table may include a field of index, a field of the percentages of the counts of read requests RQ_READ, a field of the percentages of the counts of program requests RQ_PGM and a field of the verify voltage levels.

A first entry of index 1 has program verify voltage levels Vvrf_P11, Vvrf_P21 and Vvrf_P31 which are applied when it is determined that the count of read requests RQ_READ falls in the percentage ranging from 0 to 20% and the count of program requests RQ_PGM falls in the percentage ranging from 80 to 100%.

A second entry of index 2 has program verify voltage levels Vvrf_P12, Vvrf_P22 and Vvrf_P32 which are applied when it is determined that the count of read requests RQ_READ falls in the percentage ranging from 21 to 40% and the count of program requests RQ_PGM falls in the percentage ranging from 60 to 79%.

A third entry of index 3 has program verify voltage levels Vvrf_P13, Vvrf_P23 and Vvrf_P33 which are applied when it is determined that the count of read requests RQ_READ falls in the percentage ranging from 41 to 60% and the count of program requests RQ_PGM falls in the percentage ranging from 40 to 59%.

A fourth entry of index 4 has program verify voltage levels Vvrf_P14, Vvrf_P24 and Vvrf_P34 which are applied when it is determined that the count of read requests RQ_READ falls in the percentage ranging from 61 to 80% and the count of program requests RQ_PGM falls in the percentage ranging from 20 to 39%.

A fifth entry of index 5 has program verify voltage levels Vvrf_P15, Vvrf_P25 and Vvrf_P35 which are applied when it is determined that the count of read requests RQ_READ falls in the percentage ranging from 81 to 100% and the count of program requests RQ_PGM falls in the percentage ranging from 0 to 19%.

According to an embodiment, the control unit 210 may adjust program verify voltage levels based on a verify voltage level table as exemplified in FIG. 5 in the case where n (n is an integer equal to or greater than 2) bits are stored in each memory cell. For example, in the case where three bits are stored in each memory cell (TLC: triple level cell), program verify voltages having seven different levels may be used, and each entry of the verify voltage level table may have a set of seven different program verify voltage levels.

FIG. 7 is an example of a threshold voltage distribution diagram to assist in the explanation of the program states of memory cells in the case where the level of a verify voltage for MLCs is adjusted in accordance with an embodiment of the present invention. For the sake of convenience in explanation, it is assumed that the read voltages Vrd_P10, Vrd_P20 and Vrd_P30 shown in FIG. 7 are the same as the above-described read voltages Vrd_P10, Vrd_P20 and Vrd_P30 of FIG. 5. Also, it is assumed that the program state P13, the program state P23 and the program state P33 of FIG. 7 are the same as the above-described program state P10, program state P20 and program state P30, respectively, of FIG. 5.

Referring to FIGS. 1, 6 and 7, the memory system 100 in accordance with the embodiment may include the controller 200 and the nonvolatile memory device 300.

The controller 200 may determine the percentages of the count of the read requests RQ_READ received from the host device 400 and the count of the program requests RQ_PGM received from the host device 400, and may adjust the levels of program verify voltages based on the determined percentages.

According to an embodiment, when the count of read requests RQ_READ is greater than the count of program requests RQ_PGM, the levels of program verify voltages may be increased. According to an embodiment, when the count of read requests RQ_READ is less than the count of program requests RQ_PGM, the levels of program verify voltages may be decreased.

Hereunder, for the sake of convenience in explanation, descriptions will be made for the verify voltage levels of the index 1, the index 3 and the index 5 of the verify voltage level table of FIG. 6. Also, while descriptions will be made for program states P11, P13 and P15 of lowest levels among program states, it is to be noted that the same principle may be applied to the program state P20 and the program state P30 shown in FIG. 5.

As shown in FIG. 7, the program verify voltage Vvrf_P11, the program verify voltage Vvrf_P21 and the program verify voltage Vvrf_P31 have levels lower than the program verify voltage Vvrf_P13, the program verify voltage Vvrf_P23 and the program verify voltage Vvrf_P33, respectively. In the case where memory cells are successfully programmed according to the program verify voltage Vvrf_P11 and the program verify voltage Vvrf_P13, the successfully programmed memory cells may have the program state P11 and the program state P13.

Also, the program verify voltage Vvrf_P15, the program verify voltage Vvrf_P25 and the program verify voltage Vvrf_P35 have levels higher than the program verify voltage Vvrf_P13, the program verify voltage Vvrf_P23 and the program verify voltage Vvrf_P33, respectively. In the case where memory cells are successfully programmed according to the program verify voltage Vvrf_P15 and the program verify voltage Vvrf_P13, the successfully programmed memory cells may have the program state P15 and the program state P13.

The memory cells having the program states sequentially from the program state P15 to the program state P11 have increasingly lower and wider threshold voltage distributions, as exemplified in FIG. 7; and so do the memory cells having the program states sequentially from the program state P25 to the program state P21 and the memory cells having the program states sequentially from the program state P25 to the program state P21.

According to an embodiment, the percentages of the count of read requests RQ_READ and the count of program requests RQ_PGM may be determined under the condition that the memory cells have the program state P13. The program verify voltage level Vvrf_P13 may be a reference program verify voltage level.

The program verify voltage level may be adjusted to be decreased from the program verify voltage level Vvrf_P13 in the case where the count of program requests RQ_PGM is greater than the count of read requests RQ_READ. For example, the program verify voltage Vvrf_P11 may be selected to decrease the program verify voltage from the program verify voltage level Vvrf_P13. As shown, in the program state P11 corresponding to the program verify voltage level Vvrf_P11, a threshold voltage distribution is widely dispersed when compared to the program state P13 corresponding to the program verify voltage level Vvrf_P13, and relatively many memory cells having voltages close to the read voltage Vrd_P10 are distributed. Therefore, in the case where adjustment is made from the program verify voltage Vvrf_P13 to the program verify voltage Vvrf_P11, the number of memory cells to be determined as off-cells which store MSB data "0" may increase during the program operation to memory cells to have the program state P13, and the operation speed of the program operation may become higher. In other words, as the number of times by which a program voltage is applied decreases (i.e., the time taken to perform the program verify operation decrease), a time required for completing a program operation may be shortened.

In the case of decrease from the program verify voltage Vvrf_P13 to the program verify voltage Vvrf_P11, when the read voltage Vrd_P10 is applied for a read operation for the data programmed to have the program state P13 by applying the program verify voltage Vvrf_P11, the number of memory cells to be determined as on-cells which store MSB data "1" may increase in comparison with when a program operation is performed by applying the program verify voltage Vvrf_P13, and accordingly, the number of cases where an error correction operation fails may increase. Namely, the number of times by which a read voltage is applied may increase, and as a result, the operation speed of the read operation may become lower.

On the other hand, the program verify voltage level may be increased from the program verify voltage level Vvrf_P13 in the case where the count of read requests RQ_READ is greater than the count of program requests RQ_PGM. For example, the program verify voltage Vvrf_P15 may be selected to increase the program verify voltage from the program verify voltage level Vvrf_P13. As shown, in the program state P15 corresponding to the program verify voltage level Vvrf_P15, a threshold voltage distribution is relatively concentrated when compared to the program state P13 corresponding to the program verify voltage level Vvrf_P13, and relatively small memory cells having voltages close to the read voltage Vrd_P10 are distributed. Therefore, in the case where adjustment is made from the program verify voltage Vvrf_P13 to the program verify voltage Vvrf_P15, the number of memory cells to be determined as off-cells which store MSB data "0" may decrease during the program operation to memory cells to have the program state P3, and the operation speed of the program operation may become lower. In other words, as the number of times by which a program voltage is applied increases (i.e., the time taken to perform the program verify operation increase), a time required for completing a program operation may increase.

In this case of increase from the program verify voltage Vvrf_P13 to the program verify voltage Vvrf_P15, when the read voltage Vrd_P10 is applied for a read operation for the data programmed to have the program state P3 by applying the program verify voltage Vvrf_P15, the number of memory cells to be determined as on-cells which store MSB data "1" may decrease in comparison with when a program operation is performed by applying the program verify voltage Vvrf_P13, and accordingly, the number of cases where an error correction operation fails may decrease. Namely, the number of times by which the read voltage Vrd_P10 is applied may decrease, and as a result, the operation speed of the read operation may become higher.

According to the present embodiment, the level adjustment of a program verify voltage depending on the percentages of the count of read requests RQ_READ and the count of program requests RQ_PGM, which represents the request pattern of the host device 400, leads to the adjustment of the operation speeds of the read and program operations and thus the utilization efficiency of a device may be improved. In detail, in the case where the host device 400 mainly reads data from the memory system 100 or has a high percentage of read requests, a time required for performing a read operation may be shortened by raising the level of a program verify voltage, and in the case where the host device 400 mainly stores data in the memory system 100 or has a high percentage of program requests, a time required for performing a program operation may be decreased by lowering the level of a program verify voltage.

Figure 8:
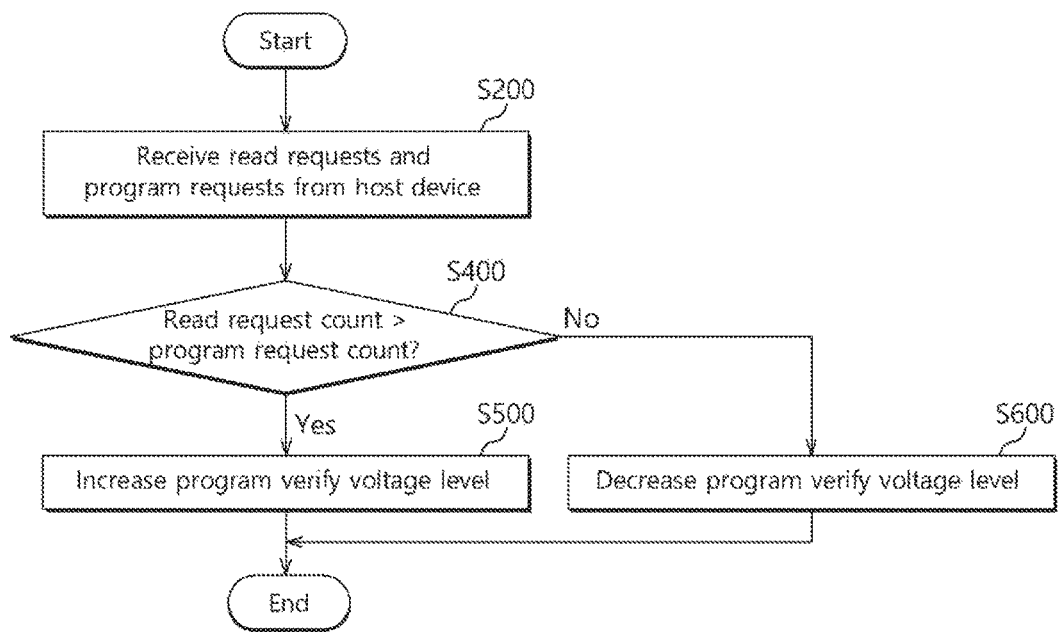
FIGS. 8 to 10 are flow charts of exemplary methods for operating a memory system in accordance with various embodiments of the present invention.
Figure 9:
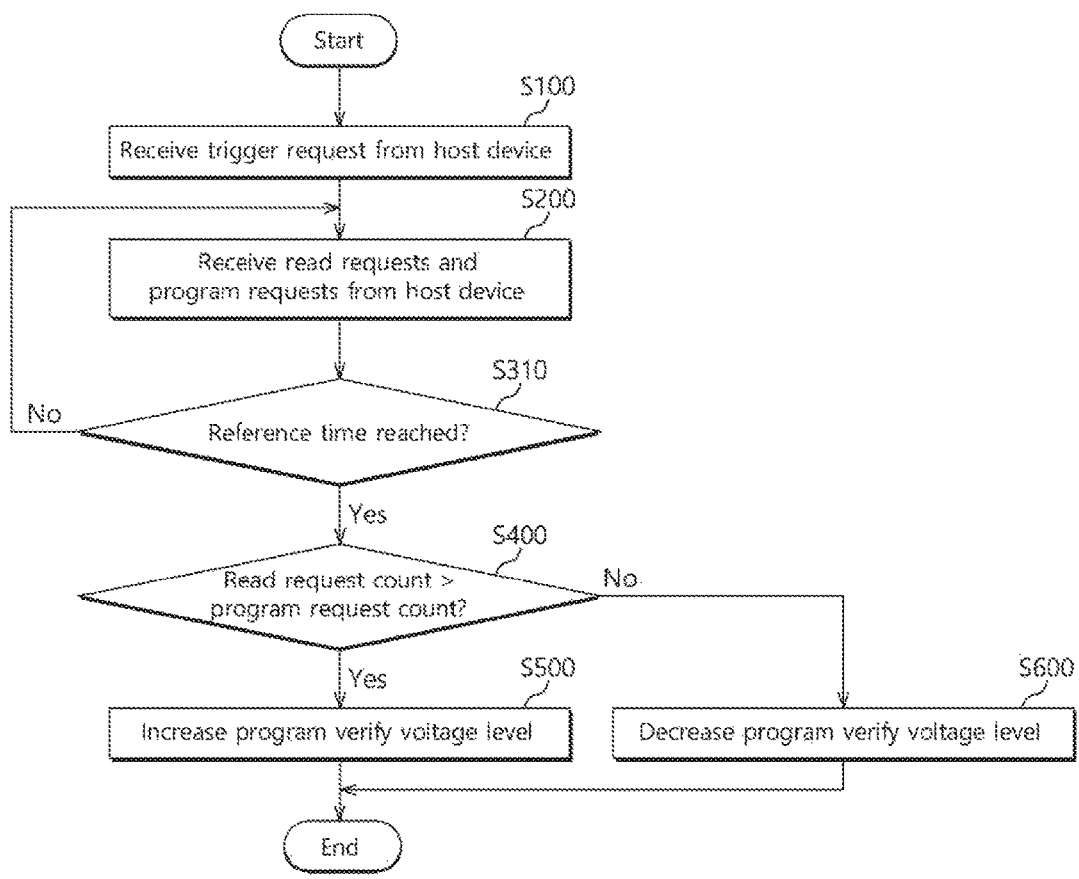
Figure 10:
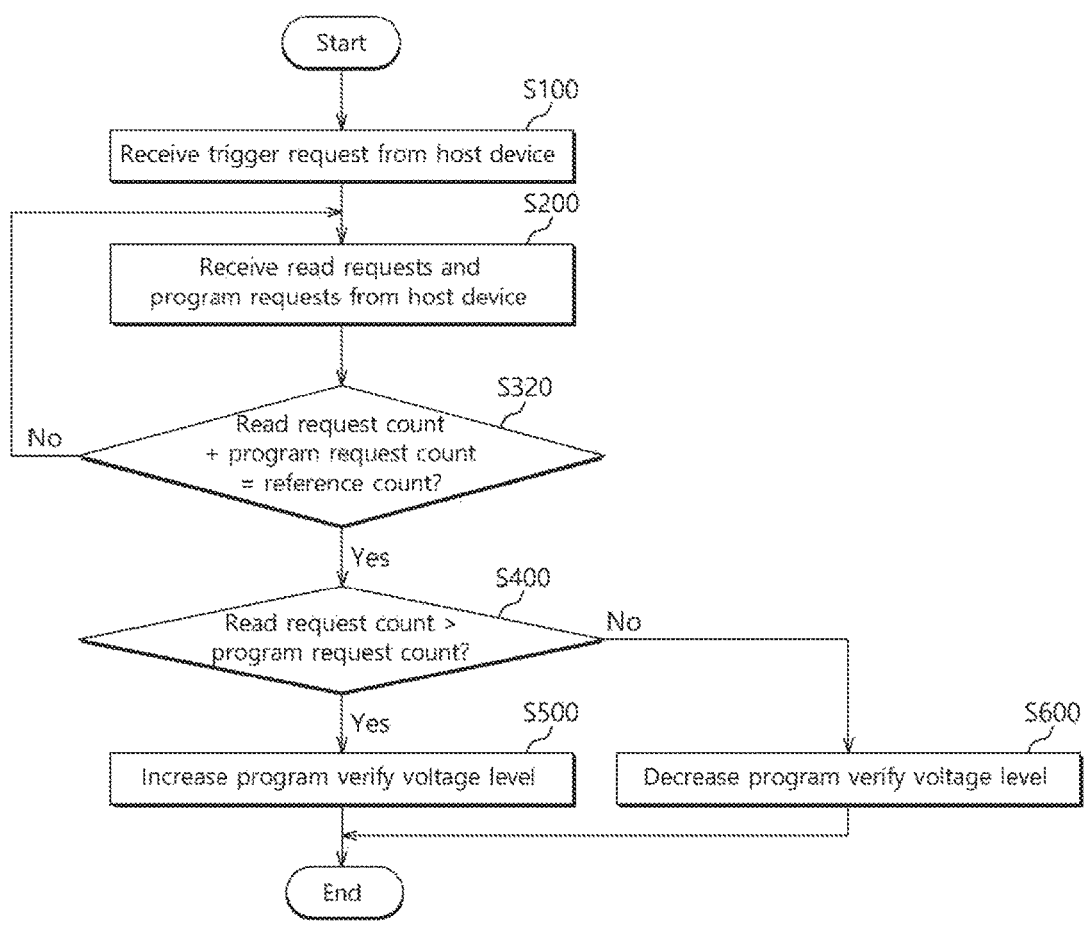

FIGS. 8 to 10 are flow charts of methods for operating a memory system in accordance with various embodiments of the present invention.

Referring to FIGS. 1 and 8, a method for operating the memory system 100 in accordance with an embodiment may include a step of receiving read requests and program requests from the host device 400 by the controller 200 at step S200, a step of comparing the count of the read requests and the count of the program requests by the controller 200 at step S400, and a step of adjusting the level of a program verify voltage to be applied to the memory cells of the nonvolatile memory device 300 based on a comparison result at steps S500 and S600.

According to an embodiment, the method may include a step of increasing a program verify voltage level in the case where the count of the read requests is greater than the count of the program requests at step S500 or a step of decreasing a program verify voltage level in the case where the count of the read requests is less than the count of the program requests at step S600.

According to an embodiment, the controller 200 may determine the percentages of the count of the read requests received from the host device 400 and the count of the program requests received from the host device 400, and may adjust the level of a program verify voltage based on the determined percentages.

According to an embodiment, the random-access memory 220 may store a verify voltage level table including the levels of program verify voltages corresponding to a plurality of percentages for the counts of read requests and the counts of program requests.

The method for operating the memory system 100 in accordance with an embodiment may include a step of determining the percentages of the count of read requests and the count of program requests (not shown), a step of selecting a program verify voltage level corresponding to the determined percentages from the verify voltage level table (not shown) and a step of applying the selected program verify voltage level (not shown).

Also, the method may further include a step of determining a program verify voltage level selected by a predetermined number of times among the program verify voltage levels included in the verify voltage level table (not shown), a step of applying the determined program verify voltage level (not shown) and a step of interrupting the operation of adjusting a program verify voltage level (not shown).

According to an embodiment, the controller 200 may receive an application request for a program verify voltage from the host device 400, and may perform a program operation for data by applying the requested program verify voltage.

Referring to FIGS. 1 and 9, a method for operating the memory system 100 in accordance with an embodiment may include receiving a trigger request from the host device 400 by the controller 200 at step S100, receiving read requests and program requests from the host device 400 by the controller 200 at step S200, determining whether a reference time has been reached from when the trigger request is received from the host device 400 at step S310, comparing the count of the read requests and the count of the program requests when the reference time has reached at step S400, and adjusting the level of a program verify voltage to be applied to the memory cells of the nonvolatile memory device 300 based on a comparison result at steps S500 and S600.

According to an embodiment, the reference time may be arbitrarily set and be changed at any time by the request of the host device 400.

According to an embodiment, the method may include increasing a program verify voltage level in the case where the count of the read requests is greater than the count of the program requests at step S500) or a step of decreasing a program verify voltage level in the case where the count of the read requests is less than the count of the program requests at step S600.

According to an embodiment, the controller 200 may determine the percentages of the count of the read requests received from the host device 400 and the count of the program requests received from the host device 400, and may adjust the level of a program verify voltage based on the determined percentages.

According to an embodiment, the random-access memory 220 may store a verify voltage level table including the levels of program verify voltages corresponding to a plurality of percentages for the counts of read requests and the counts of program requests.

The method for operating the memory system 100 in accordance with the embodiment may further include a step of determining the percentages of the count of read requests and the count of program requests (not shown), a step of selecting a program verify voltage level corresponding to the determined percentages from the verify voltage level table (not shown) and a step of applying the selected program verify voltage level (not shown).

Referring to FIGS. 1 and 10, a method for operating the memory system 100 in accordance with an embodiment may include receiving a trigger request from the host device 400 by the controller 200 at step S100, receiving read requests and program requests from the host device 400 by the controller 200 at step S200, determining whether the sum of the counts of the read requests and the program requests received from when the trigger request is received from the host device 400 has reached a reference count at step S320 comparing the count of the read requests and the count of the program requests in the case where the reference count has reached at step S400, and adjusting the level of a program verify voltage to be applied to the memory cells of the nonvolatile memory device 300 based on a comparison result at steps S500 and S600.

According to an embodiment, the reference count may be arbitrarily set and be changed at any time by the request of the host device 400.

According to an embodiment the method may include increasing a program verify voltage level in the case where the count of the read requests is greater than the count of the program requests at step S500 or decreasing a program verify voltage level in the case where the count of the read requests is less than the count of the program requests at step S600.

According to an embodiment, the controller 200 may determine the percentages of the count of the read requests received from the host device 400 and the count of the program requests received from the host device 400, and may adjust the level of a program verify voltage based on the determined percentages.

According to an embodiment, the random-access memory 220 may store a verify voltage level table including the levels of program verify voltages corresponding to a plurality of percentages for the counts of read requests and the counts of program requests. The method for operating the memory system 100 in accordance with the embodiment may further include a step of determining the percentages of the count of read requests and the count of program requests (not shown), a step of selecting a program verify voltage level corresponding to the determined percentages from the verify voltage level table (not shown) and a step of applying the selected program verify voltage level (not shown).

Figure 11:
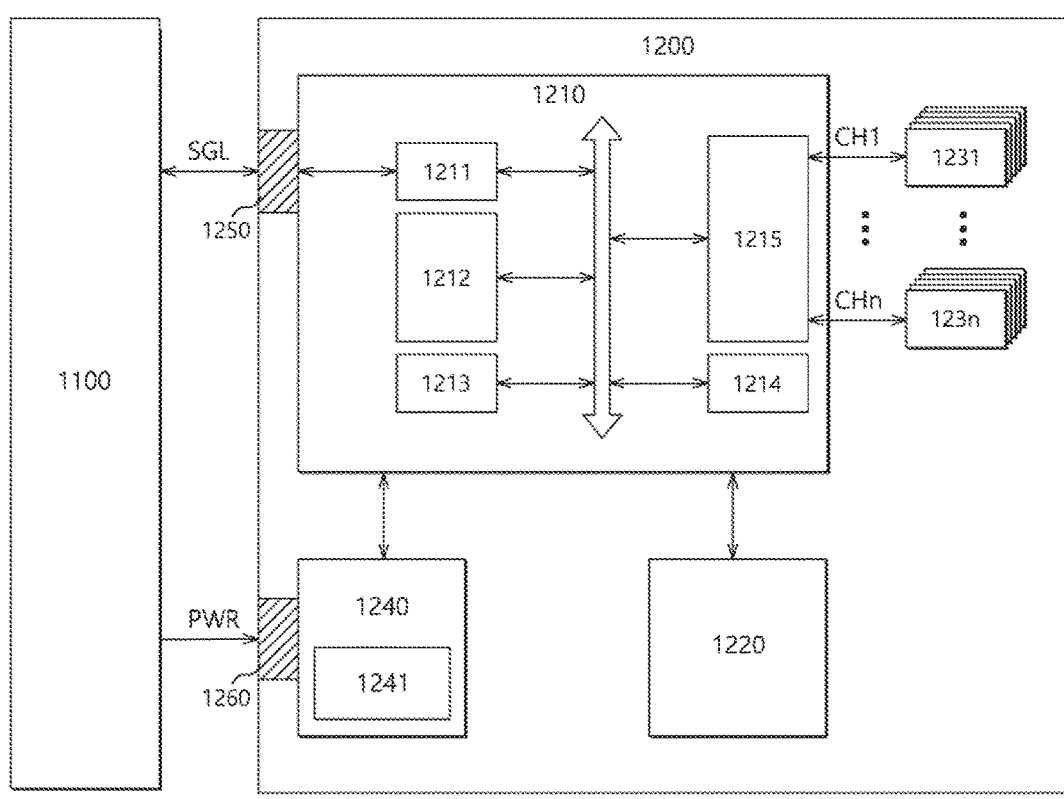
FIG. 11 is a diagram illustrating an example of a data processing system including a solid-state drive (SSD) in accordance with an embodiment of the present invention.

FIG. 11 is a diagram illustrating an example of a data processing system including a solid-state drive (SSD) in accordance with an embodiment of the present invention. Referring to FIG. 11, a data processing system 1000 may include a host device 1100 and an SSD 1200.

The SSD 1200 may include a controller 1210, a buffer memory device 1220, nonvolatile memory devices 1231 to 123n, a power supply 1240, a signal connector 1250, and a power connector 1260.

The controller 1210 may control general operations of the SSD 1200. The controller 1210 may include a host interface unit 1211, a control unit 1212, a random-access memory 1213, an error correction code (ECC) unit 1214, and a memory interface unit 1215.

The host interface unit 1211 may exchange a signal SGL with the host device 1100 through the signal connector 1250. The signal SGL may include a command, an address, data, and so forth. The host interface unit 1211 may interface the host device 1100 and the SSD 1200 according to the protocol of the host device 1100. For example, the host interface unit 1211 may communicate with the host device 1100 through any one of standard interface protocols such as secure digital, universal serial bus (USB), multimedia card (MMC), embedded MMC (eMMC), personal computer memory card international association (PCMCIA), parallel advanced technology attachment (DATA), serial advanced technology attachment (SATA), small computer system interface (SCSI), serial attached SCSI (SAS), peripheral component interconnection (PCI), PCI express (PCI-E) and universal flash storage (UFS).

The control unit 1212 may analyze and process a signal SGL inputted from the host device 1100. The control unit 1212 may control operations of internal function blocks according to a firmware or a software for driving the SSD 1200. The random-access memory 1213 may be used as a working memory for driving such a firmware or software.

The error correction code (ECC) unit 1214 may generate the parity data of data to be transmitted to the nonvolatile memory devices 1231 to 123n. The generated parity data may be stored together with the data in the nonvolatile memory devices 1231 to 123n. The error correction code (ECC) unit 1214 may detect an error of the data read out from the nonvolatile memory devices 1231 to 123n, based on the parity data. If a detected error is within a correctable range, the error correction code (ECC) unit 1214 may correct the detected error.

The memory interface unit 1215 may provide control signals such as commands and addresses to the nonvolatile memory devices 1231 to 123n, according to control of the control unit 1212. Moreover, the memory interface unit 1215 may exchange data with the nonvolatile memory devices 1231 to 123n, according to control of the control unit 1212. For example, the memory interface unit 1215 may provide the data stored in the buffer memory device 1220, to the nonvolatile memory devices 1231 to 123n, or provide the data read out from the nonvolatile memory devices 1231 to 123n, to the buffer memory device 1220.

The buffer memory device 1220 may temporarily store data to be stored in the nonvolatile memory devices 1231 to 123n. Further, the buffer memory device 1220 may temporarily store the data read out from the nonvolatile memory devices 1231 to 123n. The data temporarily stored in the buffer memory device 1220 may be transmitted to the host device 1100 or the nonvolatile memory devices 1231 to 123n according to control of the controller 1210.

The nonvolatile memory devices 1231 to 123n may be used as storage media of the SSD 1200. The nonvolatile memory devices 1231 to 123n may be coupled with the controller 1210 through a plurality of channels CH1 to CHn, respectively. One or more nonvolatile memory devices may be coupled to one channel. The nonvolatile memory devices coupled to each channel may be coupled to the same signal bus and data bus.

The power supply 1240 may provide power PWR inputted through the power connector 1260, to the inside of the SSD 1200. The power supply 1240 may include an auxiliary power supply 1241. The auxiliary power supply 1241 may supply power to allow the SSD 1200 to be normally terminated when a sudden power-off occurs. The auxiliary power supply 1241 may include large capacity capacitors.

The signal connector 1250 may be configured by various types of connectors depending on an interface scheme between the host device 1100 and the SSD 1200.

The power connector 1260 may be configured by various types of connectors depending on a power supply scheme of the host device 1100.

Figure 12:
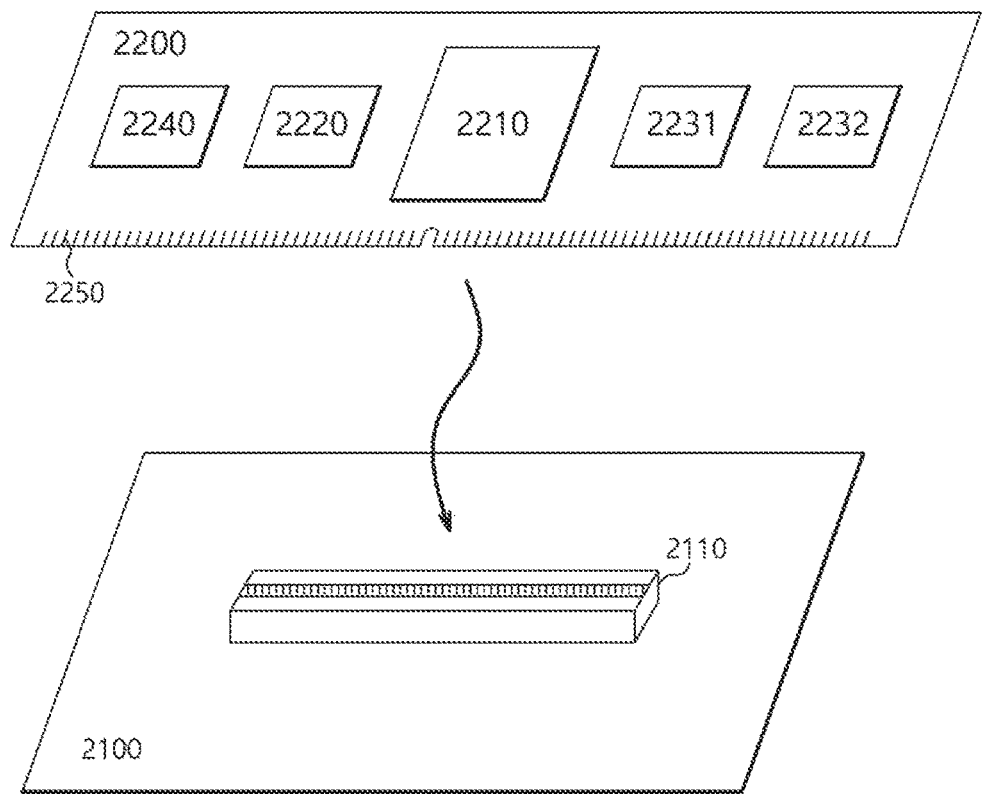
FIG. 12 is a diagram illustrating an example of a data processing system including a memory system in accordance with an embodiment of the present invention.

FIG. 12 is a diagram illustrating an example of a data processing system including a memory system in accordance with an embodiment of the present invention. Referring to FIG. 12, a data processing system 2000 may include a host device 2100 and a memory system 2200.

The host device 2100 may be configured in the form of a board such as a printed circuit board. Although not shown, the host device 2100 may include internal function blocks for performing the function of a host device.

The host device 2100 may include a connection terminal 2110 such as a socket, a slot or a connector. The memory system 2200 may be mounted to the connection terminal 2110.

The memory system 2200 may be configured in the form of a board such as a printed circuit board. The memory system 2200 may be referred to as a memory module or a memory card. The memory system 2200 may include a controller 2210, a buffer memory device 2220, nonvolatile memory devices 2231 and 2232, a power management integrated circuit (PMIC) 2240, and a connection terminal 2250.

The controller 2210 may control the general operations of the memory system 2200. The controller 2210 may be configured in the same manner as the controller 1210 shown in FIG. 11.

The buffer memory device 2220 may temporarily store data to be stored in the nonvolatile memory devices 2231 and 2232. Further, the buffer memory device 2220 may temporarily store the data read from the nonvolatile memory devices 2231 and 2232. The data temporarily stored in the buffer memory device 2220 may be transmitted to the host device 2100 or the nonvolatile memory devices 2231 and 2232 according to control of the controller 2210.

The nonvolatile memory devices 2231 and 2232 may be used as the storage media of the memory system 2200.

The PMIC 2240 may provide the power inputted through the connection terminal 2250, to the inside of the memory system 2200. The PMIC 2240 may manage the power of the memory system 2200 according to control of the controller 2210.

The connection terminal 2250 may be coupled to the connection terminal 2110 of the host device 2100. Through the connection terminal 2250, signals such as commands, addresses, data and so forth and power may be transferred between the host device 2100 and the memory system 2200. The connection terminal 2250 may be constructed into various types depending on an interface scheme between the host device 2100 and the memory system 2200. The connection terminal 2250 may be disposed on any one side of the memory system 2200.

Figure 13:
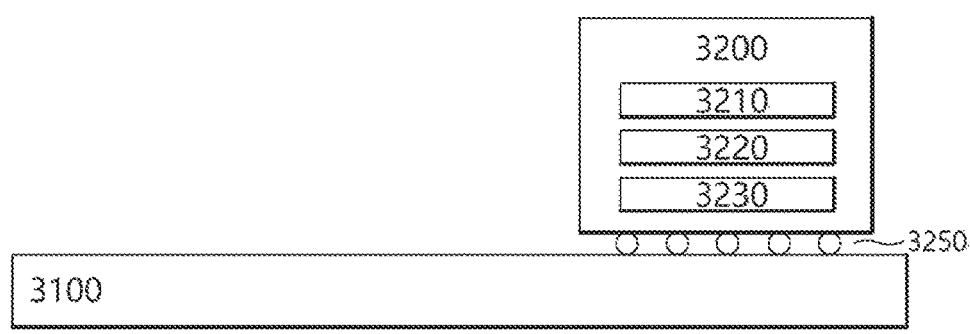
FIG. 13 is a diagram illustrating an example of a data processing system including a memory system in accordance with an embodiment of the present invention.

FIG. 13 is a diagram illustrating an example of a data processing system including a memory system in accordance with an embodiment of the present invention. Referring to FIG. 13, a data processing system 3000 may include a host device 3100 and a memory system 3200.

The host device 3100 may be configured in the form of a board such as a printed circuit board. Although not shown, the host device 3100 may include internal function blocks for performing the function of a host device.

The memory system 3200 may be configured in the form of a surface-mounting type package. The memory system 3200 may be mounted to the host device 3100 through solder balls 3250. The memory system 3200 may include a controller 3210, a buffer memory device 3220, and a nonvolatile memory device 3230.

The controller 3210 may control the general operations of the memory system 3200. The controller 3210 may be configured in the same manner as the controller 1210 shown in FIG. 11.

The buffer memory device 3220 may temporarily store data to be stored in the nonvolatile memory device 3230. Further, the buffer memory device 3220 may temporarily store the data read out from the nonvolatile memory device 3230. The data temporarily stored in the buffer memory device 3220 may be transmitted to the host device 3100 or the nonvolatile memory device 3230 according to control of the controller 3210.

The nonvolatile memory device 3230 may be used as the storage medium of the memory system 3200.

Figure 14:
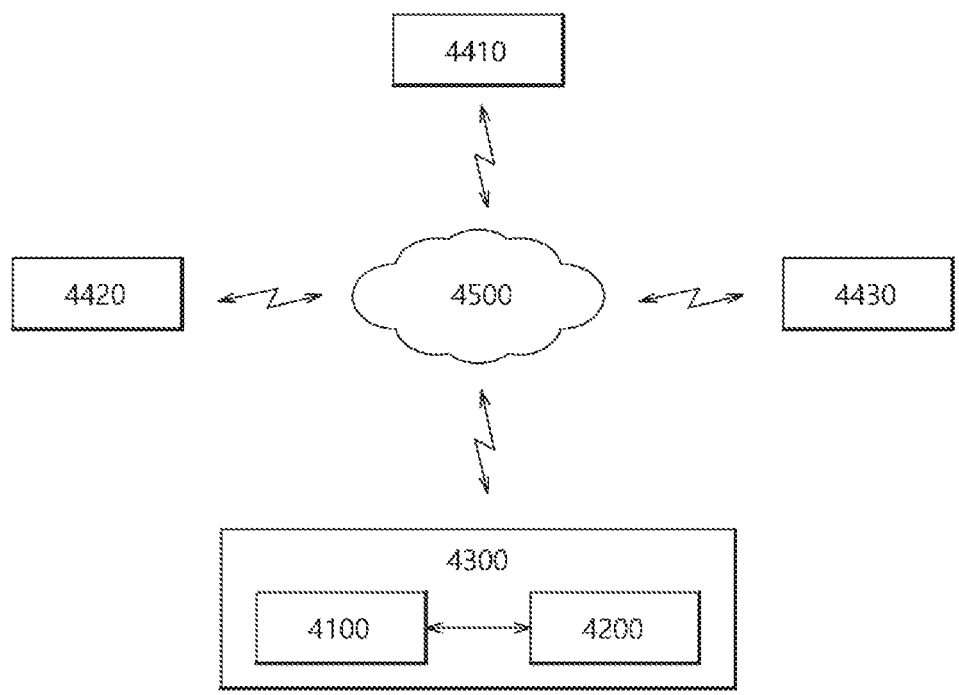
FIG. 14 is a diagram illustrating an example of a network system including a memory system in accordance with an embodiment of the present invention.

FIG. 14 is a diagram illustrating an example of a network system including a memory system in accordance with an embodiment of the present invention. Referring to FIG. 14, the network system 4000 may include a server system 4300 and a plurality of client systems 4410 to 4430 which are coupled through a network 4500.

The server system 4300 may service data in response to requests from the plurality of client systems 4410 to 4430. For example, the server system 4300 may store the data provided from the plurality of client systems 4410 to 4430. For another example, the server system 4300 may provide data to the plurality of client systems 4410 to 4430.

The server system 4300 may include a host device 4100 and the memory system 4200. The memory system 4200 may be configured by the memory system 100 of FIG. 1, the SSD 1200 of FIG. 11, the memory system 2200 of FIG. 12 or the memory system 3200 of FIG. 13.

Figure 15:
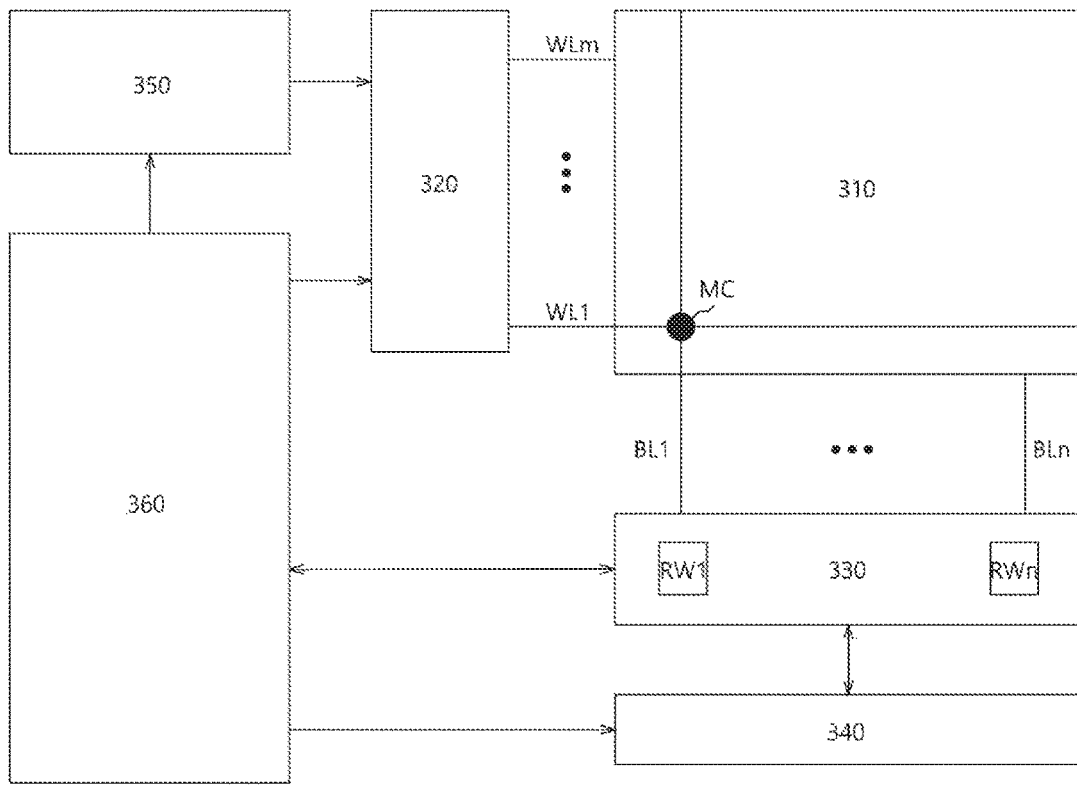
FIG. 15 is a block diagram illustrating an example of a nonvolatile memory device included in a memory system in accordance with an embodiment of the present invention.

FIG. 15 is a block diagram illustrating an example of a nonvolatile memory device included in a memory system in accordance with an embodiment of the present invention. Referring to FIG. 15, a nonvolatile memory device 300 may include a memory cell array 310, a row decoder 320, a data read/write block 330, a column decoder 340, a voltage generator 350, and a control logic 360.

The memory cell array 310 may include memory cells MC which are arranged at areas where word lines WL1 to WLm and bit lines BL1 to BLn intersect with each other.

The row decoder 320 may be coupled with the memory cell array 310 through the word lines WL1 to WLm. The row decoder 320 may operate according to the control of the control logic 360. The row decoder 320 may decode an address provided from an external device (not shown). The row decoder 320 may select and drive the word lines WL1 to WLm, based on a decoding result. For instance, the row decoder 320 may provide a word line voltage provided from the voltage generator 350, to the word lines WL1 to WLm.

The data read/write block 330 may be coupled with the memory cell array 310 through the bit lines BL1 to BLn. The data read/write block 330 may include read/write circuits RW1 to RWn respectively corresponding to the bit lines BL1 to BLn. The data read/write block 330 may operate according to the control of the control logic 360. The data read/write block 330 may operate as a write driver or a sense amplifier according to an operation mode. For example, the data read/write block 330 may operate as a write driver which stores data provided from the external device, in the memory cell array 310 in a write operation. For another example, the data read/write block 330 may operate as a sense amplifier which reads out data from the memory cell array 310 in a read operation.

The column decoder 340 may operate according to the control of the control logic 360. The column decoder 340 may decode an address provided from the external device.

The column decoder 340 may couple the read/write circuits RW1 to RWn of the data read/write block 330 respectively corresponding to the bit lines BL1 to BLn with data input/output lines (or data input/output buffers), based on a decoding result.

The voltage generator 350 may generate voltages to be used in internal operations of the nonvolatile memory device 300. The voltages generated by the voltage generator 350 may be applied to the memory cells of the memory cell array 310. For example, a program voltage generated in a program operation may be applied to a word line of memory cells for which the program operation is to be performed. For still another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control the general operations of the nonvolatile memory device 300, based on control signals provided from the external device. For example, the control logic 360 may control the read, write and erase operations of the nonvolatile memory device 300.

The descriptions for the above-described system may be applied to the methods in accordance with the embodiments. Therefore, descriptions the same as the descriptions for the above-described system are omitted in the methods.

While various embodiments have been described above, it will be understood to those skilled in the art that the embodiments described are examples only. Accordingly, the memory system and the operating method thereof described herein should not be limited based on the described embodiments.

What is claimed is:

1. A memory system comprising:
a nonvolatile memory device including a plurality of memory cells; and
a controller including a control unit and a random-access memory, and configured to determine, by applying a program verify voltage to at least one memory cell to be programmed with program data, whether the program data is programmed,
wherein the control unit determines percentages of a count of read requests received from a host device and a count of program requests received from the host device, and adjusts a level of the program verify voltage based on the percentages.

2. The memory system according to claim 1, wherein the control unit increases the level of the program verify voltage when the percentage of the count of the read requests is greater than the percentage of the count of the program requests, and decreases the level of the program verify voltage when the percentage of the count of the read requests is less than the percentage of the count of the program requests.

3. The memory system according to claim 1, wherein the control unit receives a trigger request which starts counting of the read requests and program requests, from the host device, and determines the percentages by counting read requests and program requests received from when the trigger request is received.

4. The memory system according to claim 3, wherein the control unit determines the percentages based on counts of read requests and program requests received for a predetermined time from when the trigger request is received.

5. The memory system according to claim 3, wherein the control unit determines the percentages when a sum of counts of read requests and program requests received from when the trigger request is received reaches a predetermined count.

6. The memory system according to claim 1, wherein the random-access memory stores a verify voltage level table which includes levels of verify voltages corresponding to a plurality of percentages for counts of read requests and counts of program requests, and wherein the control unit adjusts the level based on the verify voltage level table.

7. The memory system according to claim 6, wherein the control unit applies a level that is selected and applied by a predetermined number of times among the levels, to the nonvolatile memory device, and interrupts an operation of adjusting the level of the verify voltage.

8. The memory system according to claim 6, wherein the control unit receives a verify voltage setting request including any one level among the levels, from the host device, and applies the any one level to the nonvolatile memory device.

9. A memory system comprising:
a controller; and
a nonvolatile memory device configured to perform a program operation for program data in response to a program command received from the controller,
wherein the controller configured to:
determine percentages of a count of read requests received from a host device and a count of program requests received from the host device, and
perform a control task to adjust a threshold voltage distribution of memory cells to be programmed with the program data, based on the percentages.

10. The memory system according to claim 9, wherein the controller controls a verify voltage to be applied to the memory cells to have a level higher than a predetermined level, when the count of read requests is greater than the count of program requests, and controls the verify voltage to have a level lower than the predetermined level, when the count of read requests is less than the count of program requests.

11. The memory system according to claim 9, wherein the controller is configured to:
receive a trigger request which starts counting of read requests and program requests, from the host device, and
determine the percentages by counting read requests and program requests received from when the trigger request is received.

12. The memory system according to claim 11, wherein the controller is configured to determine the percentages based on counts of read requests and program requests received for a predetermined time from when the trigger request is received.

13. The memory system according to claim 11, wherein the controller is configured to determine the percentages when a sum of counts of read requests and program requests received from when the trigger request is received reaches a predetermined count.

14. A method for operating a memory system, comprising:
determining, by a controller, percentages of a count of read requests received from a host device and a count of program requests received from the host device; and
controlling an operation in which program data is programmed to a nonvolatile memory device, based on the percentages, by the controller.

15. The method according to claim 14, wherein the controlling of the operation comprises:

adjusting a level of a program verify voltage to be applied to a memory cell of the nonvolatile memory device.

16. The method according to claim 15, wherein the controlling of the operation comprises:
increasing the level when the count of read requests is greater than the count of program requests.

17. The method according to claim 15, wherein the controlling of the operation comprises:
decreasing the level when the count of read requests is less than the count of program requests.

18. The method according to claim 15, further comprising:
receiving, by the controller, a trigger request which starts counting of read requests and program requests, from the host device.

19. The method according to claim 18, wherein the controlling of the operation comprises:
determining, by the controller, whether a predetermined reference time is reached from when the trigger request is received; and
adjusting the level based on the percentages determined till the reference time.

20. The method according to claim 18, wherein the controlling of the operation comprises:
determining, by the controller, whether a sum of counts of read requests and program requests received from when the trigger request is received reaches a predetermined reference count; and
adjusting, when it is determined that the reference count is reached, the level based on the percentages determined until the reference count is reached.

* * * * *